United States Patent [19]

Powell

[11] 4,278,829
[45] Jul. 14, 1981

[54] SOLAR ENERGY CONVERSION APPARATUS

[76] Inventor: Roger A. Powell, 1589 Vernon Rd., Norristown, Pa. 19401

[21] Appl. No.: 19,784

[22] Filed: Mar. 12, 1979

[51] Int. Cl.³ .......................................... H01L 31/04
[52] U.S. Cl. .................................. 136/248; 136/257; 126/439
[58] Field of Search ........ 136/89 HY, 89 PC, 89 CL, 136/246, 247, 248; 126/270, 271, 439

[56] References Cited

U.S. PATENT DOCUMENTS

| | | | |
|---|---|---|---|
| 4,045,246 | 8/1977 | Mlavsky et al. | 136/89 PC |
| 4,052,228 | 10/1977 | Russell | 136/89 PC |
| 4,097,309 | 6/1978 | Horne | 136/89 PC |
| 4,143,233 | 3/1979 | Kapany et al. | 136/89 PC |
| 4,158,356 | 6/1979 | Wininger | 126/271 |
| 4,210,121 | 7/1980 | Stark | 126/424 |

OTHER PUBLICATIONS

T. I. Chappell et al., "Characteristics of a Water Absorber in Front of a Silicon Solar Cell", *Appl. Phys. Lett.*, vol. 28, pp. 422–423 (1976).

*Primary Examiner*—Aaron Weisstuch
*Attorney, Agent, or Firm*—Warren W. Kurz

[57] ABSTRACT

Apparatus is disclosed for converting solar energy to more useful forms, i.e., thermal and electrical energy. Such apparatus includes a photoelectric transducer (e.g., an array of photovoltaic cells), means for concentrating solar energy on the transducer, and means for circulating a liquid between the transducer and the solar energy concentrator. The spectral properties of the liquid are such that the liquid functions as a bandpass filter, transmitting solar energy to which the transducer is responsive and absorbing solar energy to which the transducer is non-responsive. The transmitted solar energy is converted to electrical energy by the transducer, and the absorbed solar energy is converted to heat by the liquid. Preferably, the liquid is circulated through a container which, in the vicinity of the transducer, is constructed so as to provide optical gain to the system and to integrate incident solar energy for the purpose of eliminating "hot spots" which could overheat, and thereby damage, the transducer.

9 Claims, 8 Drawing Figures

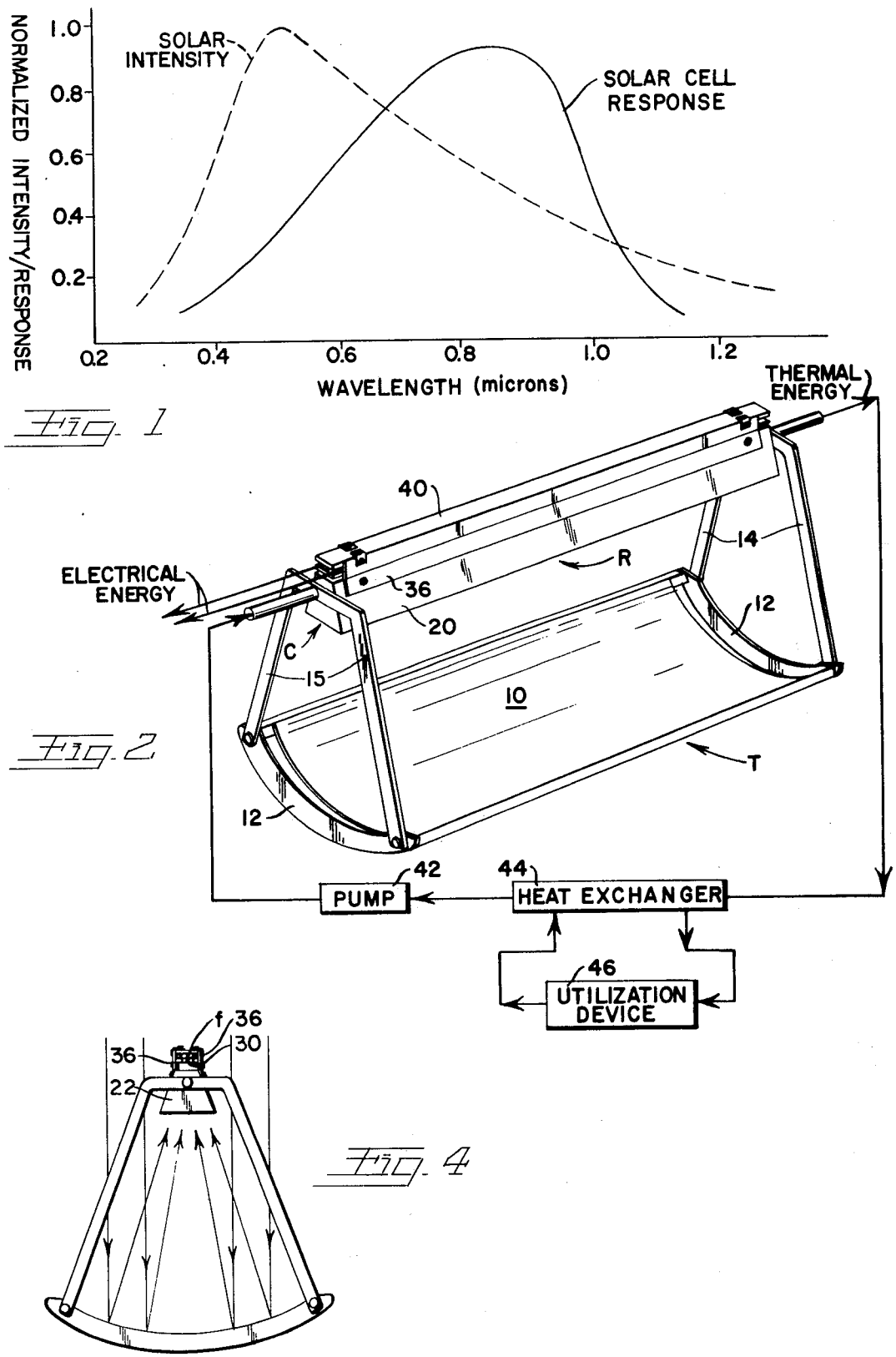

4,278,829

SOLAR ENERGY CONVERSION APPARATUS

BACKGROUND OF THE INVENTION

This invention relates to improvements in solar energy conversion apparatus. More particularly, it relates to apparatus for making more efficient use of solar energy.

Conventional solar energy conversion systems comprise a linear array of photovoltaic solar cells for directly converting incident solar energy to electrical energy. Typically, such systems make use of relatively large trough reflectors, such as those disclosed in my U.S. Pat. No. 4,119,365, for concentrating sunlight upon the solar cell array. While making much more solar energy available to the solar cells for conversion to electrical power, the large reflectors present several problems to the effective operation of the system. First, the concentrated solar energy produces intense heating of the solar cell array. If this heating is not controlled by active or passive cooling, the solar cell efficiency and lifetime will be significantly reduced. One well-known technique for alleviating the heating problem is to use optical bandpass filters to prevent those optical wavelengths of solar energy to which the solar cell is not responsive from reaching the cell. This approach, however, is very inefficient in that it fails to make use of the solar energy outside the spectral response of the solar cells.

Another problem associated with using large reflectors to concentrate solar energy on a solar cell array is that the large reflectors of the type commonly used in solar energy conversion systems are, by economic necessity, of relatively low optical quality. Hence, they are not capable of providing uniform heating of the cell array and, in fact, tend to produce "hot spots" which accentuate the heating problem and shorten the cell life. Also, due to their imperfection, these reflectors are incapable of focusing all incident radiation on the solar cells. Thus, some of the received solar energy is wasted.

SUMMARY OF THE INVENTION

According to the present invention, the aforementioned problems associated with the use of reflectors (or refractors), particularly of the large, imperfect variety, are overcome. The solar energy conversion apparatus of the invention comprises a liquid component which serves not only to filter out those wavelengths of solar energy which do not produce electrical power from a photoelectric transducer (e.g., a solar cell) and only serve to shorten its life and reduce its efficiency, but also to convert the non-useful solar energy (from the transducer's standpoint) to useful thermal energy. According to a preferred embodiment, this liquid is continuously recirculated between thermal energy-converting and heat-exchanging positions. While in the former position, the liquid is contained by a container having inclined, reflective side walls, whereby solar energy entering the container through one relatively large bottom wall is concentrated, via surface reflections from the inclined side walls, toward a smaller top wall which is positioned in close proximity to a solar cell. Both the top and bottom walls, as well as the liquid, are transparent to solar energy within the spectral response of the solar cell. The bottom wall is made of a material which additionally transmits solar energy at wavelengths outside the spectral response of the solar cell.

The invention and its various advantages will become more apparent to those skilled members of the art from the ensuing detailed description of preferred embodiments, reference being made to the accompanying drawings.

BRIEF DESCRIPTION OF THE DRAWINGS

FIG. 1 is a graph illustrating the spectral distribution of solar energy and the spectral response of a conventional solar cell;

FIG. 2 is a perspective view of a solar energy conversion apparatus incorporating a preferred embodiment of the invention;

FIG. 3 is an enlarged perspective view of a portion of the receiver component of the FIG. 2 apparatus;

FIG. 8 is a perspective view of still another embodiment of the invention.

DETAILED DESCRIPTION OF PREFERRED EMBODIMENTS

Figure 4:
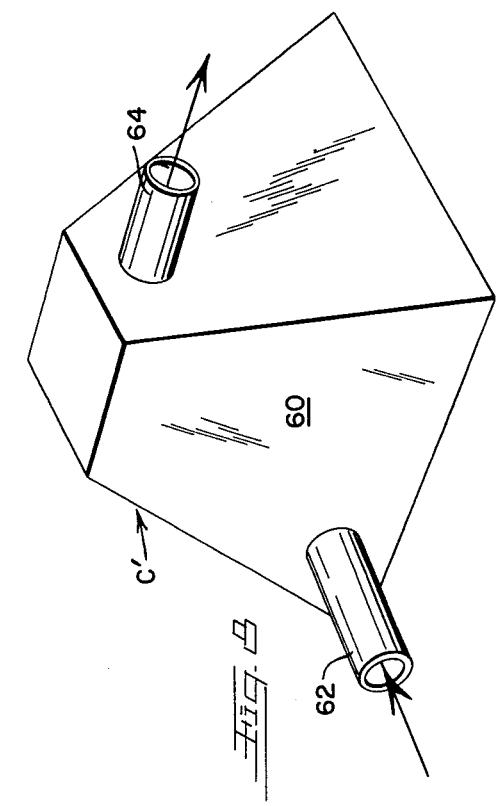
FIG. 4 is a left-side elevational view of the FIG. 2 apparatus.

Referring now to the drawings and particularly to FIG. 1, it is readily apparent that the spectral response of a silicon photovoltaic solar cell, is considerably narrower than the spectral distribution of solar energy. This means, of course, that a silicon solar cell will not respond to a great deal of the solar energy incident on it, particularly at ultraviolet and infrared wavelengths. Nevertheless, all of the solar energy incident on the cell, whether it is of a wavelength to which the cell responds or not, effects undesirable heating of the solar cell. Ideally, it would be desirable to provide a solar energy converter which converts all incident solar energy to useful forms. With this ideal in mind, the apparatus of the invention was designed.

In FIG. 2, a solar energy converter embodying the invention is shown in perspective. This apparatus comprises an elongated trough reflector T which is adapted to concentrate incident solar energy upon a receiver R. The trough reflector may comprise, for instance, a flexible reflective member 10 which is maintained in a cylindrical sector shape by frame members 12. The receiver R is supported by two pairs of struts 14, 15, so that the photoelectric transducer thereof (discussed below) is positioned coincident with the line of focus f (see FIG. 4) of the reflective member.

Figure 5:
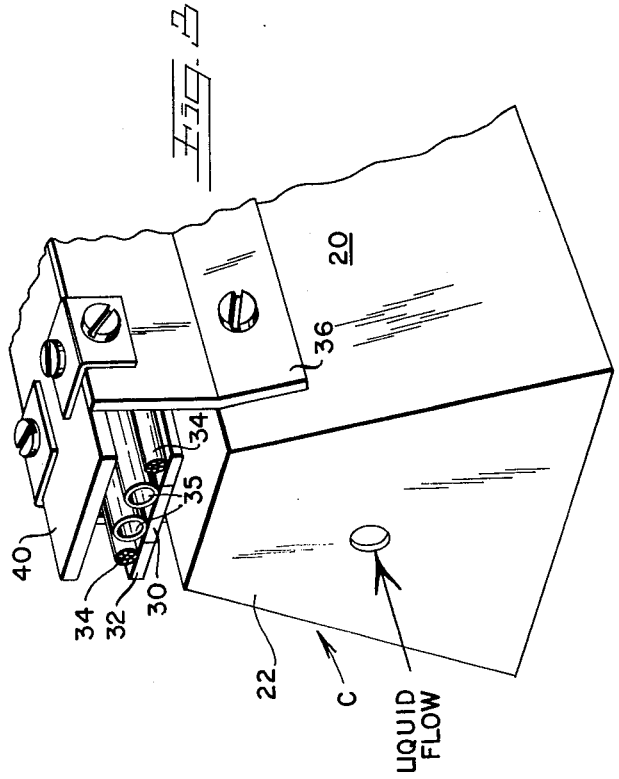
FIG. 5 is a graph illustrating the spectral transmission of various optical path lengths of water.
Figure 5:
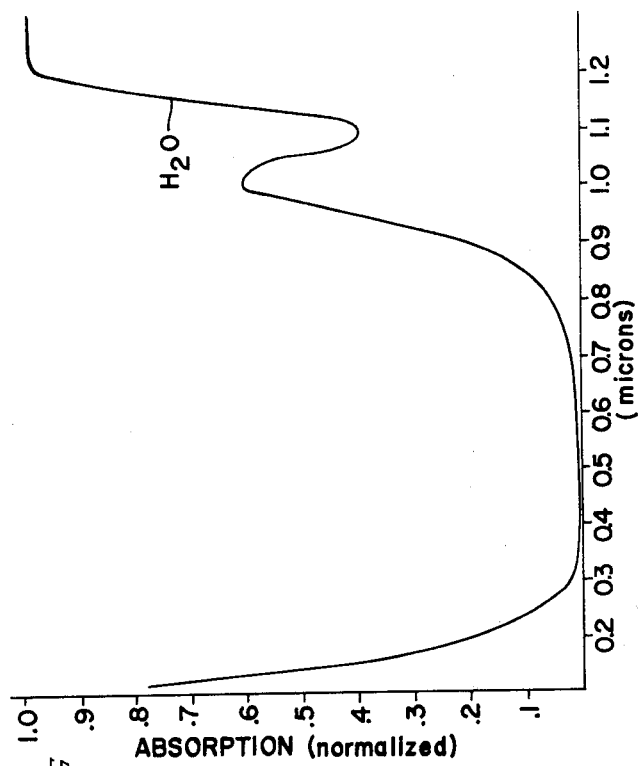
Figure 6:
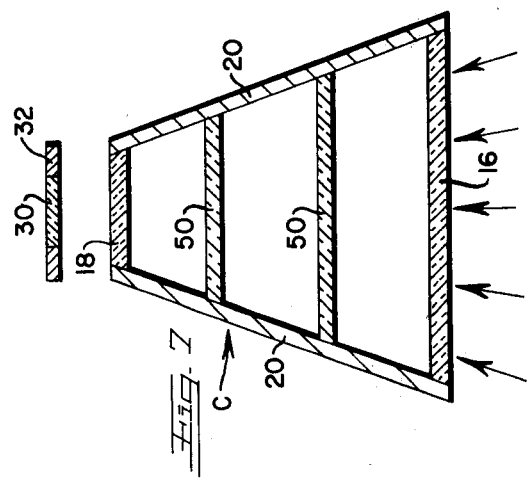
FIG. 6 is an optical diagram illustrating the respective paths of several light rays incident upon the receiver component at differing angles of incidence.

As best shown in FIG. 6, receiver R preferably comprises an elongated container or channel C of trapazoidal cross-section. This container comprises transparent bottom and top walls 16 and 18, respectively, and a pair of inclined side walls 20. Each of a pair of end walls 22 is provided with an aperture through which a liquid can flow, thereby allowing a liquid to be continuously circulated through the container. Ideally, the liquid will have a spectral transmission which matches the shape of the spectral response of the solar cell. Liquids which are particularly suitable are water, ethylene glycol and certain saline solutions. The spectral transmission characteristics of water are shown in FIG. 5.

The bottom wall 16 of container C made of good quality optical material, preferably fused quartz, which exhibits good transmission characteristics, especially within the spectral region between 0.2 and 1.6 microns. While the transparent bottom wall 16 may be provided with an antireflective coating, its main functions are to contain the liquid and to transmit as much solar energy incident thereon as possible. The side walls 20 may be made of glass or metal, and the inside surface of each is provided with a reflective coating which reflects solar energy within the spectral response of the solar cell. The top wall 18 must be transparent at least to those wavelengths within the spectral response of the solar cell. It, too, may be made of fused quartz; an alternative material is borosilicate.

Spaced from and positioned above top plate 18 (as viewed in the drawings) is a linear array of photovoltaic cells 30 which are supported by a plate 32. Upon being illuminated, each of the cells of the array generates a voltage which is summed on a pair of electrical buses 34. Positioned in thermal relationship with the rear surface of the solar cell array is a pair of cooling lines 35 which facilitate cooling the array upon being illuminated. Plate 32 is maintained in a spaced position relative to top plate 18 by a pair of brackets 36 which also support an opaque sun shade 40.

In use, reflector element 10 is directed at the sun by a suitable solar tracking device (not shown), and a liquid having suitable spectral characteristics, as heretofore described, is advanced, by a pump 42, through container C in a direction parallel to the line of focus of the reflector element. Solar energy within the spectral response of the solar cell array is transmitted by the transparent bottom and top plates of the container, as well as by the liquid flowing therebetween. This transmitted solar energy is directly converted to electrical energy by the solar cell array. Solar energy outside the spectral response of the solar cells is absorbed by the liquid and thereby converted yto thermal energy. This thermal energy may be extracted from the filtering liquid by a heat exchanger 42 and may then be used by a utilization device (e.g., a hot water heater). Solar energy which does not impinge upon the solar cell directly from the reflector element, but which is incident upon the reflective internal side walls of the container is reflected toward the solar cell array by one or more side wall reflections. These rays mix with direct rays at the output end (i.e., at top plate 18) of the container and thereby provide a more uniform flux density at the surface of the solar cell array.

The liquid, as mentioned above, is chosen to have an absorption filtration effect on the incoming solar energy outside the spectral response of the solar cells. When used with a silicon solar cell, it should be highly absorbing at wavelengths less than 0.5 microns and particularly at wavelengths greater than 1.1 microns. In this manner the "non-useful" energy (i.e., that energy which produces no electrical voltage from the solar cells) is intercepted before it reaches the solar cells. By filtering out the solar energy below 0.5 microns and above 1.1 microns, approximately 50% of the energy that must be dissipated as heat at the solar cells never reaches the cells. Thus the cells are exposed primarily to energy that is converted to electrical power. The maximum temperature of the liquid is a function of the incoming solar energy, the absorptivity and flow rate of the liquid, and the energy losses of the receiver. Reasonably high temperatures can be readily attained since the maximum allowable temperature of the solar cell is not a constraint.

Figure 7:
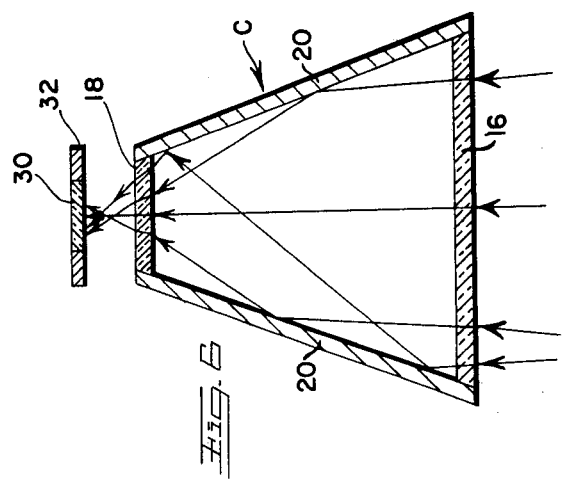
FIG. 7 is a cross-sectional view of another embodiment of the invention.

As shown in FIG. 5, water is relatively transparent to radiant energy at wavelengths between 0.2 and 1.0 microns. Thus, incident solar energy within this bandpass will be transmitted to the solar cells for conversion to electrical energy. Solar energy outside this bandpass will be absorbed by the water and converted to heat. It should be noted that while water alone will not filter out the solar energy components in the 0.2 to 0.5 micron range, such energy provides only a minor effect in producing the undesired heating of the solar cell array; that is, most of the heating is due to infrared energy and, as already noted, this energy is absorbed by water and thereby prevented from reaching the cells. To supplement the filtration characteristics of water for the purpose of eliminating solar energy in the 0.2 to 0.5 micron spectral range, dyes, such as used in gelatin-based photographic filters, can be mixed with water. These dyes behave in effect as bandpass filters. Alternatively, one or more solid bandpass filters 50 can be mounted within container C, as is shown in the drawing of FIG. 7.

In FIG. 8 another type of container C' is shown for containing the solar energy filtrating liquid described above. As shown, the container has the shape of a truncated pyramid 60. Liquid is introduced into the container through conduit 62 and removed therefrom by conduit 64. This particular shape is useful in combination with a reflector element of the dish variety, or with a conventional spherical refractive element.

Although the invention has been described with particular reference to preferred embodiments, it will be understood that variations and modifications can be effected within the spirit and scope of the invention as described hereinabove and as defined in the appended claims.

I claim:

1. A solar energy conversion apparatus comprising:
   (a) a photoelectric transducer for converting incident solar energy within a particular spectral region to electrical energy;
   (b) a selectively absorbing liquid adapted to transmit solar energy within said spectral region and to absorb solar energy outside said spectral region, whereby the absorbed solar energy is converted to thermal energy in said liquid;
   (c) means for supporting said liquid on an optical path between the sun and said transducer, said supporting means comprising a container having front and rear walls which are substantially transparent to solar energy within said spectral region, said front wall being additionally transparent to solar energy of wavelengths absorbed by said liquid, said container further comprising reflective side walls between said front and rear walls, said side walls acting to redirect incident solar energy toward said rear wall;
   (d) means for supporting said transducer in a position spaced from said rear wall to thermally isolate said transducer from said liquid, whereby said liquid can be heated to a temperature which exceeds the optimal operating temperature of said transducer;
   (e) supplemental absorbing means positioned within said container to absorb solar energy within a particular spectral bandpass to which said liquid is transparent; and
   (f) means for extracting thermal energy from said liquid for utilization.

2. The apparatus as defined by claim 1 wherein said supplemental absorbing means comprises a liquid soluble dye.

3. The apparatus as defined by claim 1 wherein said supplemental absorbing means comprises a solid filter element.

4. A solar energy conversion apparatus comprising:
   (a) a photoelectric transducer for converting incident solar energy within a particular spectral region to electrical energy;
   (b) a selectively absorbing liquid adapted to transmit solar energy within said spectral region and to absorb solar energy outside said spectral region, thereby converting the solar energy outside said spectral region to thermal energy in said liquid;
   (c) means for supporting said liquid on an optical path between the sun and said transducer;
   (d) means for thermally isolating said liquid from said transducer, whereby said liquid can be maintained at a temperature exceeding the optimal operating temperature of said transducer;
   (e) means for circulating said liquid between a position on said optical path and heat exchanging means to extract thermal energy from said liquid; and
   (f) supplemental absorbing means in said liquid for converting solar energy to which said liquid is transmissive and which is outside said spectral region to thermal energy.

5. The apparatus as defined by claim 4 wherein said liquid comprises water.

6. The apparaus as defined by claim 4 wherein said support means comprises a container having opposing walls which are transmissive of solar energy within said spectral region, and at least one of said walls is additionally transmissive of solar energy outside said spectral region.

7. The apparatus as defined by claim 6 wherein said container comprises a pair of reflective side walls which are inclined with respect to each other to redirect incident solar radiation entering said container through one of said opposing walls toward the other of said opposing walls.

8. The apparatus as defined by claim 4 wherein said supplemental absorbing means comprises a solid filtering element.

9. The apparatus as defined by claim 4 wherein said supplemental absorbing means comprises a liquid-soluble dye.

* * * * *